United States Patent
Wu et al.

(10) Patent No.: US 11,160,169 B2
(45) Date of Patent: Oct. 26, 2021

(54) COMPONENT CARRIER WITH COMPONENT EMBEDDED IN CAVITY AND WITH DOUBLE DIELECTRIC LAYER ON FRONT SIDE

(71) Applicant: AT&S (Chongqing) Company Limited, Chongqing (CN)

(72) Inventors: Yu-Hui Wu, Taoyuan (TW); Christopher Katzko, Chongqing (CN)

(73) Assignee: AT&S (Chongqing) Company Limited, Chongqing (CN)

( * ) Notice: Subject to any disclaimer, the term of this patent is extended or adjusted under 35 U.S.C. 154(b) by 0 days.

(21) Appl. No.: 16/529,085

(22) Filed: Aug. 1, 2019

(65) Prior Publication Data
US 2020/0045825 A1    Feb. 6, 2020

(30) Foreign Application Priority Data

Aug. 3, 2018    (CN) .......................... 201821251521.4

(51) Int. Cl.
*H05K 1/18*    (2006.01)
*H05K 1/03*    (2006.01)
(Continued)

(52) U.S. Cl.
CPC ........... *H05K 1/186* (2013.01); *H05K 1/0204* (2013.01); *H05K 1/036* (2013.01); *H05K 1/0366* (2013.01);
(Continued)

(58) Field of Classification Search
CPC .... H05K 1/185; H05K 3/4697; H05K 1/0271; H05K 3/4644; H05K 1/0298;
(Continued)

(56) References Cited

U.S. PATENT DOCUMENTS 10,674,608 B2 *   6/2020   Park ....................... H05K 1/185
2003/0132434 A1 *   7/2003   Hirano ................ H01L 51/5088
  257/40
(Continued)

FOREIGN PATENT DOCUMENTS

JP   2014-183179 A   9/2014
WO   2017168323 A1   10/2017
WO   2017168342 A1   10/2017

OTHER PUBLICATIONS

Anon, Ajinomoto Build-up Film, Extract from web site accessible at https://www.ajinomoto.com/en/rd/our_innovation/abf/ ; Jul. 29, 2019, 4 pp.

*Primary Examiner* — Mandeep S Buttar
(74) *Attorney, Agent, or Firm* — Robert A. Blaha; Smith Tempel Blaha LLC

(57) ABSTRACT

A component carrier includes a base structure with component carrier material and forming a cavity, a component embedded in the cavity, a first electrically insulating layer structure connected to a front side of the base structure and to the component and at least partially filling a gap between the component and the base structure, and a second electrically insulating layer structure connected to the first electrically insulating layer structure at a connection surface of the first electrically insulating layer structure. The connection surface opposes an opposing surface of the second electrically insulating layer structure faces away from the first electrically insulating layer structure.

17 Claims, 3 Drawing Sheets

(51) Int. Cl.
*H05K 3/46* (2006.01)
*H05K 3/42* (2006.01)
*H05K 1/02* (2006.01)
H05K 3/00 (2006.01)

(52) U.S. Cl.
CPC ............ *H05K 3/42* (2013.01); *H05K 3/4682* (2013.01); *H05K 3/0032* (2013.01); *H05K 2201/0145* (2013.01); *H05K 2201/0195* (2013.01); *H05K 2201/068* (2013.01); *H05K 2203/107* (2013.01)

(58) Field of Classification Search
CPC ......... H05K 2203/1469; H05K 3/4602; H05K 2201/068; H05K 3/007; H05K 3/4652; H05K 1/0373; H05K 1/183; H05K 3/4688; H05K 2201/09136; H05K 3/4655; H05K 1/036; H01L 21/4857; H01L 2924/3511; H01L 21/568; H01L 23/49822; H01L 23/5383; H01L 2224/02331
USPC .................................. 361/707, 717
See application file for complete search history.

(56) References Cited

U.S. PATENT DOCUMENTS

| | | | | |
|---|---|---|---|---|
| 2011/0041910 A1* | 2/2011 | Shimomura | ........ | H01L 31/1892 136/256 |
| 2014/0291859 A1* | 10/2014 | Kiwanami | ............. | H05K 1/185 257/774 |
| 2016/0196913 A1* | 7/2016 | Kim | .................... | H01F 17/0013 336/83 |
| 2016/0365327 A1 | 12/2016 | Shimodaira et al. | | |

* cited by examiner

COMPONENT CARRIER WITH COMPONENT EMBEDDED IN CAVITY AND WITH DOUBLE DIELECTRIC LAYER ON FRONT SIDE

TECHNICAL FIELD

The invention relates to a component carrier. Furthermore, the invention relates to a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

In particular, efficiently embedding a component in a component carrier is an issue.

SUMMARY

There may be a need to efficiently embed a component in a component carrier.

A component carrier and a method of manufacturing a component carrier according to the independent claims are provided.

According to an exemplary embodiment, a component carrier is provided, wherein the component carrier comprises: i) at least one electrically insulating layer structure and at least one electrically conductive layer structure, wherein the electrically conductive layer structure is formed in or below the electrically insulating layer structure, and ii) a laser via formed in the electrically insulating layer structure and extending down to the electrically conductive layer structure, wherein the laser via is at least partially filled with an electrically conductive material. Hereby, a connection diameter at a first end of the laser via at the electrically conductive layer structure is equal to or larger than an opening diameter at a second end of the laser via facing away from the electrically conductive layer structure.

According to a further exemplary embodiment, a method of manufacturing a component carrier is provided. The method comprises: i) forming a stack of at least one electrically insulating layer structure and at least one electrically conductive layer structure, wherein the electrically conductive layer structure is formed in or below the electrically insulating layer structure, ii) forming a laser via, in particular by using laser drilling, in the electrically insulating layer structure such that the laser via extends down to the electrically conductive layer structure, and such that a connection diameter at a first end of the laser via at the electrically conductive layer structure is equal to or larger than an opening diameter at a second end of the laser via facing away from the electrically conductive layer structure. The method may be applied to manufacture the described component carrier and may thus provide the same advantages.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, a metal core substrate, an inorganic substrate and an IC (integrated circuit) substrate. A component carrier may also be a hybrid board combining different ones of the above-mentioned types of component carriers.

In the context of the present application, the term "component carrier material" may particularly denote a connected arrangement of one or more electrically insulating layer structures and/or one or more electrically conductive layer structures as used in component carrier technology. More specifically, such component carrier material may be material as used for printed circuit boards (PCBs) or IC substrates. In particular, electrically conductive material of such a component carrier material may comprise copper. Electrically insulating material of the component carrier material may comprise resin, in particular epoxy resin, optionally in combination with reinforcing particles such as glass fibres or glass spheres.

In the context of the present application, the term "cavity" may particularly denote a recess, in particular at least one a through-hole and a blind hole, extending partially or entirely through the base structure. It is also possible that the cavity is closed from a bottom side by a temporary or permanent carrier. The cavity may be configured for accommodating the component.

In the context of the present application, the term "front side of the base structure" may particularly denote a side corresponding to a main surface of the base structure via which the component is inserted in the cavity.

According to an exemplary embodiment of the invention, a component carrier manufacturing technology is provided in which two electrically insulating layer structures are connected (in particular laminated) both to the front side of a base structure via which also the component is inserted into the cavity of the base structure. The formation of the first electrically insulating layer structure may be carried out with the purpose of reliably filling the gap between the component and the component carrier material of the base structure, and optionally also other remaining empty voids of the cavity which are not occupied by the component. The first electrically insulating layer structure however needs not necessarily be planar but can even have an exterior connecting surface having a pronounced surface profile, since the function of the first electrically insulating layer structure is mainly encapsulation of the component in the cavity, but not necessarily the provision of a planarized surface. Moreover, by the subsequent provision of a separate second electrically insulating layer structure which is connected to the exterior connecting surface of the first electrically insulating layer structure and has, in turn, an exterior opposing surface which may be planar, it may be possible to at least partially remove uneven surface profiles of the dielectric exterior surface. By separating the dielectric lamination on the front side into two distinguishable procedures involving different electrically insulating layer structures, it may be possible to focus the configuration of the first electrically insulating layer structure on embedding or encapsulation purposes, while using the second electrically insulating layer structure for improving the planarity of the component carrier on the exterior side. By taking this measure, warpage may be suppressed and the homogeneity and symmetry of the component carrier may be increased. Moreover, by separating the front side dielectric lamination into two separate procedures, an independent selection of the materials of the layer structures may be enabled, thereby allowing refining the functionalization of the component carrier by the electrically insulating layer structures.

According to an exemplary embodiment of the invention, a dielectric layer on a front side of a base structure and on an embedded component can be separated into two layers, which may be formed in accordance with two different recipes. It is thus possible to carry out a twice lamination architecture, i.e. involving two times a lamination on one side of the base structure and the component. This may allow solving undulation and encapsulation issues for packages with one or more embedded components. At the same time, it may be possible to improve the thickness distribution with the same lamination frequency. As a result, an improved encapsulation performance may be obtained. Moreover, a better undulation performance may become possible. Beyond this, an improved dielectric thickness distribution may be achieved. Furthermore, a flexible total dielectric thickness control may be obtained.

In the following, further exemplary embodiments of the method and the component carrier will be explained.

Any number of cavities (i.e. one or more cavities) may be provided in the component carrier. Correspondingly, any number of components (i.e. one or more components) may be provided in the component carrier. Furthermore, it is possible that multiple components can be placed in one cavity. Alternatively, a single component may be placed in a respective cavity.

In an embodiment, the opposing surface has a flatter surface profile than the connection surface. Thus, by the second electrically insulating layer structure, the planar character of the exterior dielectric surface may be enhanced. A reliable encapsulation of the component can thereby be combined with a flat and even exterior appearance of the component carrier.

In an embodiment, the surface profile at the connection surface has a maximum bottom-to-top distance in a range between 0.1 μm and 80 μm (or 80% of the thickness of component carrier). The surface profile at the opposing surface may have a maximum bottom-to-top distance lower than the maximum bottom-to-top distance at the connection surface. Thus, the connection surface can show a significant unevenness or surface profile. However, the latter may be reduced or eliminated by the planarizing effect of the second electrically insulating layer structure.

In an embodiment, the connecting surface is non-planar (or uneven) and the opposing surface is planar (or flat). Hence, a lacking planarity of the encapsulating first electrically insulating layer structure may be compensated by the separate second electrically insulating layer structure focusing on planarity.

In an embodiment, a roughness of the connecting surface is in a range between 0.1 μm and 2 μm or 80% of the thickness of component carrier. Additionally or alternatively, a roughness of the opposing surface is in a range between 0.3 μm and 1 μm. The mentioned roughness values can be measured by a profilometer and/or by analyzing a cross section of the component carrier or a preform thereof.

A profilometer may be denoted as a measuring instrument used to measure a surface's profile, in order to quantify its roughness. Critical dimensions as step, curvature, flatness may be computed from the surface topography. Such a profilometer may implement optical methods (such as interferometric-based methods, focus detection methods and/or pattern projection methods). It is also possible that such a profilometer implements contact or pseudo-contact methods (for instance using a stylus profilometer, an atomic force microscopy device, or a scanning tunneling microscopy device). In particular, the roughness on the connection surface may be higher than, lower than or equal to the roughness on the opposing surface. For instance, the opposing surface may be rougher than the connection surface when a desmear or an etching process is carried out on it. In another processing sequence, the connection surface may be rougher than the opposing surface.

In terms of the present application, "flatness" or "unevenness" may relate to a more macroscopic surface profile of the respective surface. In contrast to this, the term "roughness" may refer to more microscopic ripples on a surface.

In an embodiment, a maximum thickness of the first electrically insulating layer structure on the base structure is in a range between 20% and 80%, in particular in a range between 55% and 65%, of an entire maximum thickness of the first electrically insulating layer structure plus the second electrically insulating layer structure on the base structure. Additionally or alternatively, a maximum thickness of the second electrically insulating layer structure on the base structure may be in a range between 20% and 80%, in particular in a range between 35% and 45%, of an entire maximum thickness of the first electrically insulating layer structure plus the second electrically insulating layer structure on the base structure. In accordance with the different functions between the first electrically insulating layer structure and the second electrically insulating layer structure, also a separate thickness adaptation of the two mentioned layer structures can promote the improved compliance with the mentioned functions. In particular when the first thickness of the first electrically insulating layer structure is about 60% and the second thickness of the second electrically insulating layer structure is about 40% of the summed thickness of both electrically insulating layer structures together, it has turned out that the quality of encapsulation and the planarity of the obtained layer base structure show both good properties. It is for instance also possible that a homogeneous thickness of a preform of the first electrically insulating layer structure, i.e. the first electrically insulating layer structure before connection to the base structure and the component, is in a range between 20% and 80%, in particular between 55% and 65%, as compared to a homogeneous thickness of the preform of the second electrically insulating layer structure before connection to the component and the base structure and the first electrically insulating layer structure, which may have a thickness in a range of 80% to 20%, in particular 35% to 45%. The sum of both thick-nesses may result in 100%. Hence, the individual thickness of the two electrically insulating layer structures is a further design parameter for optimizing a void-free encapsulation of the component in the cavity on the one hand and a high degree of external planarity on the other hand. Thus, the two thicknesses may be selected differently.

In an embodiment, the first electrically insulating layer structure has a larger maximum thickness on the base structure than a maximum thickness of the second electrically insulating layer structure on the base structure. Since material of the first electrically insulating layer structure flows into tiny gaps between component, base structure and optionally a temporary carrier, usually a higher amount of dielectric material is required as compared to the material of the second electrically insulating layer structure providing a planarizing effect. Therefore, the described stronger weighting of the volume and hence thickness of the first electrically insulating layer structure as compared to the second electrically insulating layer structure contributes to an improved suppression of warpage and other undesired effects.

In one embodiment, a material of the first electrically insulating layer structure is the same as a material of the second electrically insulating layer structure. When both electrically insulating layer structures are made of the same material (in particular resin, optionally comprising reinforcing particles such as glass fibres), no material bridge between different materials is formed at the connection surface. An interior of the component carrier is thus homogeneously filled with dielectric material of the same nature. This homogeneity of the material translates into a homogeneity of the physical properties, prevents CTE (coefficient of thermal expansion) mismatch, suppresses delamination tendencies and reduces thermal load acting on the component carrier in the presence of temperature changes, in particular temperature cycles.

In another embodiment, a material of the first electrically insulating layer structure is different from a material of the second electrically insulating layer structure. In this alternative embodiment, the different materials of the first electrically insulating layer structure and the second electrically insulating layer structure may be used as a design parameter for refining the desired properties of the component carrier. Also, the different functions of the first electrically insulating layer structure (in particular void-free embedding of the component) and of the second electrically insulating layer structure (in particular providing a flat exterior surface) may be further refined by a corresponding configuration of the respective material.

In an embodiment, the first electrically insulating layer structure comprises a functionalized material (i.e. a material providing one or more additional technical functions). For instance, the functionalized material may be a heat dissipation material, a stiffener material and/or a coefficient of thermal expansion (CTE) balancing material. In other words, the material of the first electrically insulating layer structure which is located deeply inside the interior of the component carrier may be functionalized to provide for instance a heat removing or heat spreading function, a mechanical reinforcement and/or a robustness against high thermal load. For providing a heat dissipation function by the material of the first electrically insulating layer structure, this material may be for instance made with a sufficiently high value of the thermal conductivity, for instance at least 1 W/mK. For reinforcing the stiffness of the component carrier, reinforcing particles (or a higher amount of reinforcing particles as compared to the second electrically insulating layer structure) may be provided within the first electrically insulating layer structure. A suppression of the CTE mismatch may be obtained by using a material for the first electrically insulating layer structure which is selected so that differences in the value of the coefficient of thermal expansion in different regions in an interior of the component carrier are at least partially compensated.

In an embodiment, at least one of the first electrically insulating layer structure and the second electrically insulating layer structure comprises resin, in particular epoxy resin, and optionally reinforcing particles, in particular at least one of glass fibers and glass spheres. For instance, prepreg sheets may be used for this purpose.

In an embodiment, the second electrically insulating layer structure forms part of at least one of the group consisting of a polyethylene terephthalate (PET) film on an Ajinomoto® Build-up Film (ABF), a copper foil on a prepreg sheet, a copper foil on an Ajinomoto® Build-up Film, photosensitive insulation material or photo-imageable dielectric (PID), and Resin Coated Copper (RCC). Thus, in particular the second electrically insulating layer structure may form part of a composite of two or more layers, which may be placed above on another or which may be attached to one another prior to its connection to the base structure. In particular the combination of an ABF film and a PET foil is an advantageous double layer having dielectric proper-ties. Also, a copper foil on a prepreg sheet is a simple and efficient way of configuring the second electrically insulating layer structure. An RCC film is another advantageous embodiment.

In an embodiment, at least part of at least one of the first electrically insulating layer structure and the second electrically insulating layer structure is in an at least partially uncured state before the connecting. In the context of the present application, the term "at least partially uncured material" particularly denotes material which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause melting of the curable or at least partially uncured material, followed by an irreversible hardening upon releasing the applied high pressure and/or high temperature. In particular, the "at least partially uncured material" may comprise or consist of B-stage material and/or A-stage material. By providing the respective layer structure from resin, prepreg or any other B-stage material, the layer structure may re-melt during lamination so that resin (or the like) may flow for interconnecting the various elements and for closing gaps or voids and may therefore contribute to a stable intrinsic interconnection within the component carrier being manufactured. When the two separate electrically insulating layer structures are both at least partially uncured before the connection (in particular lamination) procedure, they may become flowable by the application of pressure and/or heat. For the first electrically insulating layer structure this has the advantage that even tiny gaps between component, base structure and optionally temporary carrier may be reliably and substantially void-free filled with resin material or the like. Also, for improving the planarity of the layer stack, an at least partially uncured property of the second electrically insulating layer structure before connection (in particular lamination) is highly advantageous. Descriptively speaking, the flowable resin material of the second electrically insulating layer structures may also fill gaps in the surface profile on the connection surface of the first electrically insulating layer structure.

In an embodiment, the method comprises attaching a temporary carrier to a backside of the base structure before placing the component in the cavity and on the temporary carrier. In particular, the method may comprise removing the temporary carrier from the backside of the base structure after the connecting of the first electrically insulating layer structure. For in-stance, such a temporary carrier may be a sticky tape which may be attached to the backside of the base structure and which may close a through-hole in the base structure for delimiting the cavity. The component may then be placed on the sticky surface of the temporary carrier so as to ensure a correct positioning of the component. After having attached and connected (in particular by lamination) the first electrically insulating layer structure to the base structure and the component while simultaneously filling the gaps in between with material of the first electrically insulating layer structure to thereby obtain a rigid structure, the temporary carrier is no longer needed and can be removed from the backside.

In an embodiment, the method comprises simultaneously connecting the second electrically insulating layer structure to the first electrically insulating layer structure and connecting a third electrically insulating layer structure to a backside of the base structure, the component, and optionally the first electrically insulating layer structure. A simultaneous execution of the second lamination procedure on the front side (thereby connecting the second electrically insulating layer structure) and a first lamination on the backside (thereby connecting the third electrically insulating layer structure) allows for a quick and efficient manufacturing process.

In an embodiment, a maximum thickness of the connected third electrically insulating layer structure is larger than a maximum thickness of the connected second electrically insulating layer structure. Since the third electrically insulating layer structure may be the result of a first lamination on the backside and the lamination on the front side involves two electrically insulating layer structures (i.e. the first and the second), a symmetric and homogeneous composition of the component carrier can be obtained when the thickness of the third electrically insulating layer structure is larger than the thickness of the second electrically insulating layer structure. For instance, the thickness of the third electrically insulating layer structure may be larger than the thickness of the second electrically insulating layer structure but smaller than the sum of the thicknesses of the first electrically insulating layer structure and the second electrically insulating layer structure to be laminated on the front side.

In an embodiment, the component carrier comprises a barrier layer, in particular capable of blocking migration of chlorine ions, between the first electrically insulating layer structure and the second electrically insulating layer structure. Chlorine ions, which may occur during the manufacturing process, may negatively influence the constitution of the component carrier (in particular PCB), in particular in the presence of embedded components. However, by carrying out the two above-described front side lamination procedures, the mentioned barrier layer may be formed which advantageously contributes to inhibit or at least reduce migration of the chlorine ions and related particles.

In an embodiment, the method comprises forming at least one electrically conductive vertical through connection through both the first electrically insulating layer structure and the second electrically insulating layer structure for electrically contacting the component after connecting the second electrically insulating layer structure to the first electrically insulating layer structure. Hence, after having carried out the above-described lamination procedures for embedding the component and planarizing the front side as well as achieving a homogeneous arrangement on front side and back side, the manufacturing process may be continued with a formation of vertical through-connections such as copper filled vias. This may electrically contact the embedded electronic component (for instance pads of a semiconductor chip or pads of a passive component such as a capacitor). The formation of such vertical interconnect structures may also contact for instance patterned electrically conductive layer structures on a surface of the base structure being now covered with the electrically insulating layer structures.

In an embodiment, the method comprises connecting at least one further electrically insulating layer structure and/or at least one electrically conductive layer structure onto a respective exterior one of the electrically insulating layer structures. Hence, a build-up of the component carrier may be continued on one or both sides by laminating one or more further electrically insulating structures and/or electrically conductive layer structures on either of these sides.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. How-ever, the component may also be a further component carrier, for example in a board-in-board configuration. One or more components may be surface mounted on the component carrier and/or may be embedded in an interior thereof. Moreover, also other than the mentioned components may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise photosensitive insulation material or photo-imageable dielectric (PID), resin and/or glass fibers, so-called prepreg or FR4 material. The various electrically conductive layer structures may be connected to one another in a desired way by forming through-holes through the laminate, for instance by laser drilling, photo imaging or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, dielectric material of the base structure and/or at least one further electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, at least one electrically conductive layer structure of the component carrier comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the semifinished product or the component carrier is a compound of multiple layer structures which are stacked and connected together by applying a pressing force, if desired accompanied by heat.

DETAILED DESCRIPTION OF ILLUSTRATED EMBODIMENTS

Figure 1:
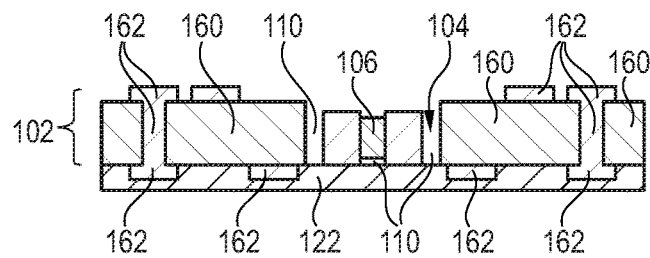
FIG. 1, FIG. 2, FIG. 3, FIG. 4, FIG. 5 and FIG. 6 illustrate cross-sectional views of structures obtained during carrying out a method of manufacturing a component carrier with an embedded component, shown in FIG. 6, according to an exemplary embodiment of the invention.

The aspects defined above and further aspects of the invention are apparent from the examples of embodiment to be described hereinafter and are explained with reference to these examples of embodiment.

The illustrations in the drawings are schematic. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment, a twice lamination method for manufacturing a package with an embedded component is provided.

Generally, manufacturing methods for packages with embedded component may apply a single lamination process for one side only. It is difficult to control the encapsulation capability and dielectric flatness with a single lamination.

According to an exemplary embodiment of the invention, a double lamination procedure on one side of a base structure of component carrier material and a component may be accomplished. In such a scenario, the first lamination may focus on the encapsulation capability and performance. The separate second lamination may focus on dielectric flatness and patterning on it, i.e. for flattening an exterior surface of the laminated dielectric. In an embodiment, it is also possible to apply different lamination recipes for the two separate lamination procedures to get better performance for each stage and control the total thickness with more flexibility.

More specifically, it may be possible to apply a twice lamination procedure, i.e. two times lamination on one side. This may allow solving undulation and encapsulation issues in methods of manufacturing a component carrier with embedded component. Such a procedure may also improve the thickness distribution, heat dissipation and warpage with the same lamination frequency.

In an embodiment, the first lamination may be accomplished with about 60% of dielectric thickness to encapsulate the component in a cavity in the base structure. Thereafter, it may be possible to remove a temporary carrier such as a sticky tape from the backside and proceed with pre-treatment (for instance as POR process). Subsequently, a second lamination with approximately 40% of dielectric thickness may be carried out to flat the surface of the top layer. In sum, a lamination with 100% of dielectric thickness may be created for both layers.

For example, the first lamination material can be a heat dissipation material, a stiffener material and/or a CTE (coefficient of thermal expansion) balance material in order to obtain a further heat removal and/or warpage improvement.

A gist of an exemplary embodiment is a separation of the first dielectric layer on an embedded component to two individual layers, optionally manufactured in accordance with two different recipes. By such a concept, one or more of the following advantages may be obtained:

Better encapsulation performance
Better undulation performance
Better dielectric thickness distribution
Flexible total dielectric thickness control
Solution for heat dissipation and warpage issue.

Figure 4:
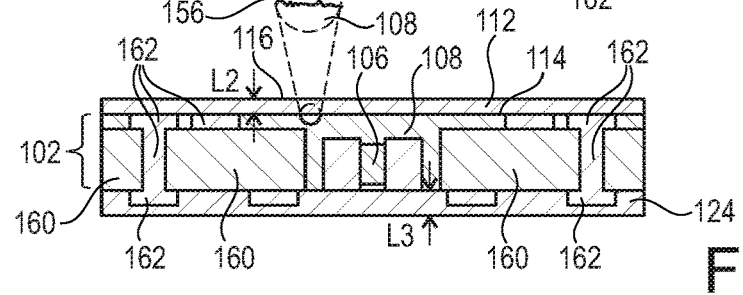
Figure 5:
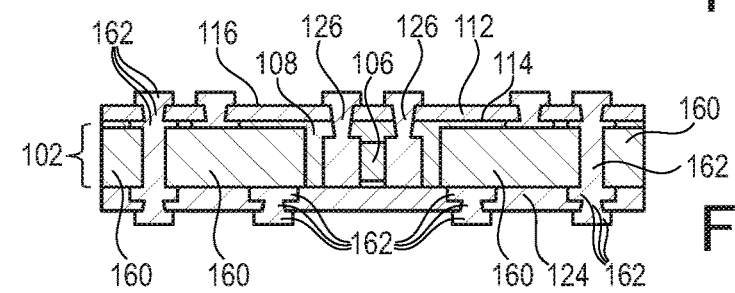
Figure 6:
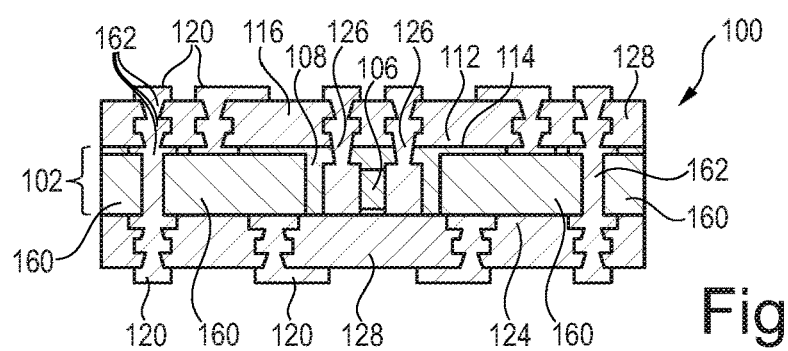

FIG. 1 to FIG. 6 illustrate cross-sectional views of structures obtained during carrying out a method of manufacturing a component carrier 100 with an embedded component 106, shown in FIG. 6, according to an exemplary embodiment of the invention.

The arrangements illustrated in FIG. 1 to FIG. 6 show a twice lamination method for an embedding process of a component in a cut or drilled core.

Referring to FIG. 1, a component 106 is placed in a cavity 104 of a base structure 102 comprising a layer stack of PCB material. For instance, the component may be an active component such as a semiconductor chip or a passive component such as a capacitor. The base structure 102 of component carrier material may be a connected layer sequence of one or more electrically insulating layer structures 160 (such as resin, for instance epoxy resin, optionally comprising reinforcing particles such as glass fibers) and electrically conductive layer structures 162 (such as copper foils and copper plated through holes). The component carrier material may hence be material as used for manufacturing component carriers such as printed circuit boards (PCB).

The cavity 104 may be formed in the base structure 102, for instance by laser cutting or milling. As can be taken from FIG. 1 as well, a temporary carrier 122 (such as a sticky foil) is attached to a backside of the base structure 102 before placing the component 106 in the cavity 104.

As shown in FIG. 1, a core panel is provided as base structure 102. The core panel comprises the central fully cured thick electrically insulating structure 160 (for instance made of FR4 material) which is covered on both opposing main surfaces with a respective one of the electrically conductive layer structures 162, here embodied as a respective patterned copper foil. Mechanical vias or other vertical through-connections may be drilled through the electrically insulating layer structure 160 for contacting two opposing main surfaces of the base structure 102. The core panel has a central through-hole forming the cavity 104. A bottom of this through-hole is closed by the temporary carrier 122 attached to the backside of the base structure 102.

The component 106 is then placed on the exposed sticky surface of the temporary carrier 122 and in the cavity 104. As can be taken from FIG. 1, gaps 110 remain between lateral sidewalls of the base structure 102 and lateral sidewalls of the component 106. Moreover, gaps 110 may remain between a lower surface of the component 106 and an upper sticky surface of the temporary carrier 122.

Figure 2:
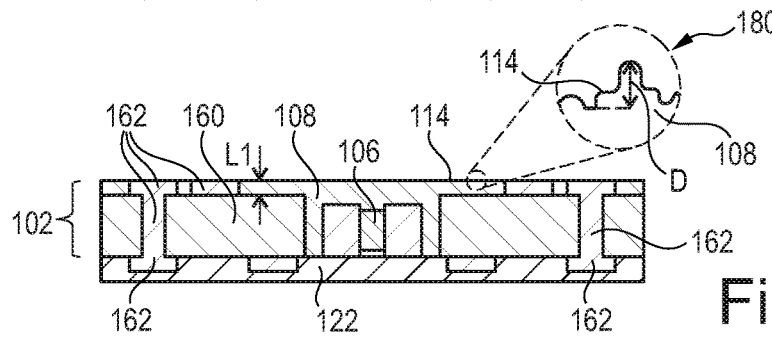

Referring to FIG. 2, a first electrically insulating layer structure 108 is connected to a front side of the base structure 102 and to the component 106 so that the connected first electrically insulating layer structure 108 also fills the gaps 110 between the component 106, the base structure 102 and the temporary carrier 122. The first electrically insulating layer structure 108 may be in an uncured state before the connecting. For example, the first electrically insulating layer structure 108 may be a prepreg sheet.

As shown in FIG. 2, a first encapsulation lamination may be carried out by attaching the first electrically insulating layer structure 108 to the front side of the base structure 102 as well as to the component 106. A thickness of the first electrically insulating layer structure 108 before lamination may be in a range between 5 µm and 20 µm, in particular 15 µm. With this relatively thin first electrically insulating layer structure 108, the gaps 110 between the component 106 on the one hand and the core and the temporary carrier 122 on the other hand may be filled with resin material becoming flowable by the application of pressure and/or heat, i.e. by curing the first electrically insulating layer structure 108 in the framework of a lamination process. The first electrically insulating layer structure 108 therefore provides for ensuring a proper encapsulation of the component 106 and can result in a non-planar exterior connecting surface 114.

The lamination material of the first electrically insulating layer structure 108 can be of many kinds of material, like ABF material, prepreg, molding material, heat dissipation material, stiffener material, photosensitive insulation material or photo-imageable dielectric (PID), CTE (coefficient of thermal expansion) balance material, etc.

Figure 3:
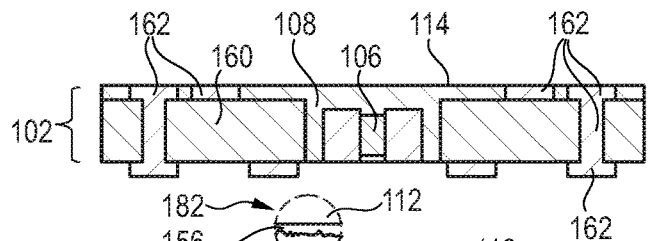

Referring to FIG. 3, the temporary carrier 122 may be removed from the backside of the base structure 102 after the lamination of the first electrically insulating layer structure 108. As can be taken from FIG. 3, the adhesion film in form of temporary carrier 122 is then removed, for instance peeled off. After the described lamination process, the structure shown in FIG. 3 becomes rigid and no longer requires mechanical support by the temporary carrier 122.

Referring to FIG. 4, a second electrically insulating layer structure 112 is connected by lamination directly (i.e. without another layer in between) to the first electrically insulating layer structure 108 at a connection surface 114 of the first electrically insulating layer structure 108. The connection surface 114 opposes an exterior opposing surface 116 of the second electrically insulating layer structure 112 facing away from the first electrically insulating layer structure 108. Thus, a second lamination on the front side is carried out according to FIG. 4. During this lamination, second electrically insulating layer structure 112 is connected to the connecting surface 114 by lamination, i.e. the application of heat and/or pressure. By this second lamination on the front side, gaps or valleys on the non-planar connection surface 114 may be filled with resin material during lamination of the previously uncured second electrically insulating layer structure 112. As a result of this second front side lamination, planar opposing surface 116 on an exterior side of the second electrically insulating layer structure 112 is obtained.

The opposing surface 116 has a flatter or smoother surface profile than the connection surface 114. A detail 180 in FIG. 2 shows a pronounced surface profile at the connection surface 114 of the first electrically insulating layer structure 108. The opposing surface 116 of the second electrically insulating layer structure 112 has a significantly less pronounced surface profile at the connection surface 114 of the first electrically insulating layer structure 108. As shown in detail 180 as well, the surface profile at the connection surface 114 has a maximum bottom-to-top distance D of for instance 5 µm. This value is much larger than a maximum bottom-to-top distance at the opposing surface 116, see also detail 182. The connection surface 114 is non-planar, whereas the opposing surface 116 is planar.

More precisely, the second electrically insulating layer structure 112 is connected to the first electrically insulating layer structure 108 in a common lamination process simultaneously carried out during connecting a third electrically insulating layer structure 124 to a backside of the base structure 102, the component 106, and the part of the first electrically insulating layer structure 108 filling the gaps 110. A maximum thickness L3 of the connected third electrically insulating layer structure 124 may be larger than a maximum thickness L2 of the connected second electrically insulating layer structure 112. Simultaneously with the lamination of the second electrically insulating layer structure 112 to the front side, the third electrically insulating layer structure 124 is laminated on the backside. The second electrically insulating layer structure 112 may for instance have a thickness of 10 µm, more generally in a range between 5 µm and 20 µm, before laminating it on the front side. Thus, the second electrically insulating layer structure 112 may be thinner than the first electrically insulating layer structure 108. A homogeneous dielectric coverage of the front side and of the backside may thereby be obtained.

As can be taken from detail 182 in FIG. 4, the shown structure comprises a barrier layer 156 capable of blocking migration of chlorine ions between the first electrically insulating layer structure 108 and the second electrically insulating layer structure 112. The barrier layer 156 has the effect of preventing chlorine ions, which may be generated during the manufacturing process of the component carrier 100, from diffusing through the layer structures of the component carrier 100. This has a positive effect on the mechanical integrity of the component carrier 100, in particular in view of the embedded component 106 which may be critical in this respect in conventional approaches.

What concerns the formation of the barrier layer 156, there are in particular two possibilities: In one embodiment, it is possible to form the barrier layer 156 as a separate layer after formation of the first electrically insulating layer structure 108 and before the formation of the second electrically insulating layer structure 112. In such an embodiment, the barrier layer 156 may be formed for instance by deposition, lamination, coating, etc. In another embodiment, it is possible that the barrier layer 156 is formed as an interface layer forming an interface between the first electrically insulating layer structure 108 and the second electrically insulating layer structure 112. In such an interface layer, material of the two electrically insulating layer structures 108, 112 combines by mixing, migration, diffusion and/or (in particular chemical) reaction so as to form a distinguishable barrier layer 156 comprising constituents of both electrically insulating layer structures 108, 112.

Referring to FIG. 5, one or more further electrically conductive vertical through connections 126 may be formed extending through both the first electrically insulating layer structure 108 and the second electrically insulating layer structure 112 for electrically contacting the component 106 after connecting the second electrically insulating layer structure 112 to the first electrically insulating layer structure 108.

In order to obtain the layer structure shown in FIG. 5, via and pattern formation procedures may be carried out. By taking this measure, the embedded component 106 can be externally contacted, and the electrically insulating layer structure 162 on the thick electrically insulating layer structure 160 may be electrically contacted as well. Via formation may for instance be carried out by laser via drilling followed by a copper plating procedure. In various embodiments, the connection of the components can be from the front side only, from the back side only, or from both sides (i.e. from the front side and the back side).

Referring to FIG. 6, one or more further electrically insulating layer structures 128 and one or more further electrically conductive layer structures 120 may be formed onto a respective exterior one of the second and third electrically insulating layer structures 112, 124.

By completing the described manufacturing procedure, component carrier 100 according to an exemplary embodiment of the invention is obtained. In the shown embodiment, the first electrically insulating layer structure 108 and the second electrically insulating layer structure 112 may be made of the same material. This material may be for example uncured epoxy resin for reflowing and finally adhering during lamination. The material may additionally comprise glass fibers for reinforcing purposes. As shown in FIG. 6, the component carrier 100 has further build-up layers on both front and backside of the layer structures shown in FIG. 5, formed by further lamination, via formation and via filling procedures.

Figure 10:
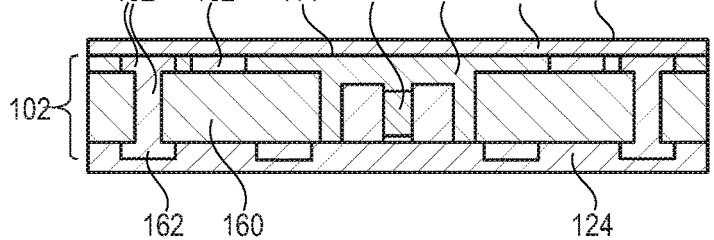
Figure 11:
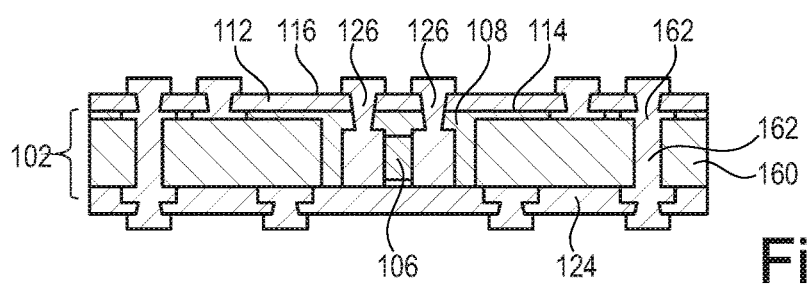
Figure 12:
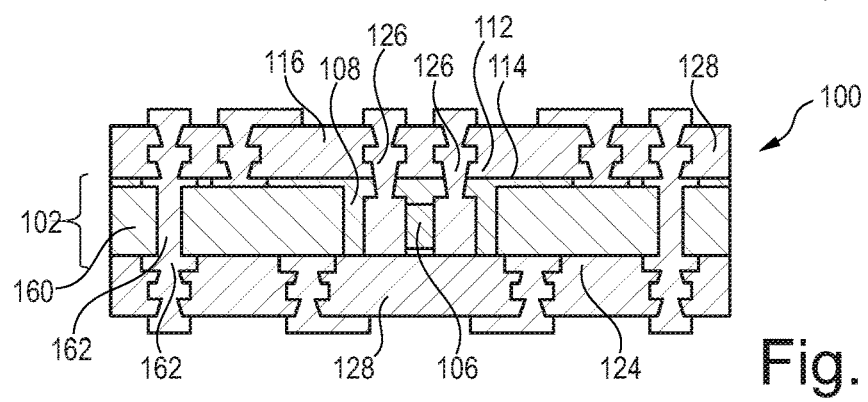

FIG. 7 to FIG. 12 illustrate cross-sectional views of structures obtained during carrying out a method of manufacturing a component carrier 100 with an embedded component 106, shown in FIG. 12, according to another exemplary embodiment of the invention.

The second embodiment of the manufacturing method will be described referring to FIG. 7 to FIG. 12, which differs from the previously described embodiment of FIG. 1 to FIG. 6 in particular by the fact that the second electrically insulating layer structure 112 is made from a different material than the first electrically insulating layer structure 108 according to FIG. 7 to FIG. 12. In contrast to this, the material of the first and the second electrically insulating layer structures 108, 112 has been identical in the embodiment of FIG. 1 to FIG. 6.

Again, referring to FIG. 7, a structure corresponding to the structure of FIG. 1 is shown.

Figure 7:
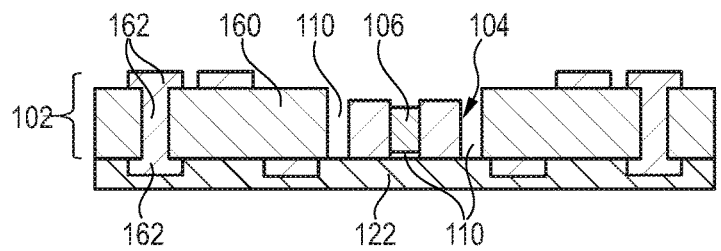
FIG. 7, FIG. 8, FIG. 9, FIG. 10, FIG. 11 and FIG. 12 illustrate cross-sectional views of structures obtained during carrying out a method of manufacturing a component carrier with an embedded component, shown in FIG. 12, according to an exemplary embodiment of the invention.
Figure 8:
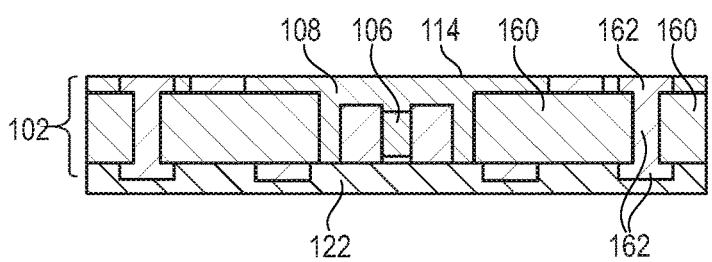

The structure shown in FIG. 8 is obtained by encapsulating the component 106 by lamination of the first electrically insulating layer structure 108 on the front side of the layer structure shown in FIG. 7. In the described embodiment, the encapsulation material of the first electrically insulating layer structure 108 may be different from the surface material provided by the second electrically insulating layer structure 112 (see FIG. 10). For instance, the first electrically insulating layer structure 108 may comprise a heat dissipation material for providing a heat dissipation function, may comprise a stiffener material for warpage suppression and/or may comprise a CTE (coefficient of thermal expansion) balance material for warpage improvement as well. Thus, the cavity filling material may be functionalized according to the embodiment of FIG. 7 to FIG. 12.

Figure 9:
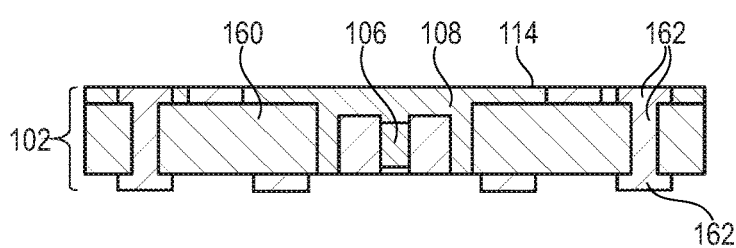

In order to obtain the layer structure shown in FIG. 9, the temporary carrier 122 is peeled off from a backside.

FIG. 10 shows the result of a second lamination on the front side, i.e. the lamination of the second electrically insulating layer structure 112 which can be carried out in the way as described above referring to FIG. 4.

As second lamination material in the framework of a SAP (semi-additive process), it can be an insulating Build-up film material (for example Ajinomoto Build-up film (ABF)®) or prepreg, prepreg with primer, PID (photo imageable dielectric) material, etc. Ajinomoto Build-up film (ABF) is a registered trademark of Ajinomoto Co., Inc. of Tokyo, Japan.

As can be taken from FIG. 11, via and pattern formation can then be accomplished (compare FIG. 5).

Referring to FIG. 12 and in contrast to FIG. 6, a component carrier 100 is shown in which the material of the first electrically insulating layer structure 108 is different from the material of the second electrically insulating layer structure 112. For example, the first electrically insulating layer structure 108 comprises a heat dissipation material, a stiffener material, and/or a coefficient of thermal expansion balancing material. Thus, the material of the first electrically insulating layer structure 108 may be specifically functionalized. In contrast to this, the second electrically insulating layer structure 112 may for example comprise curable resin optionally equipped with reinforcing particles such as glass spheres. Moreover, a further build-up layer of an SRSF (Solder Resister & Surface Finish) process may then be carried out to obtain the component carrier 100 according to FIG. 12.

Figure 13:
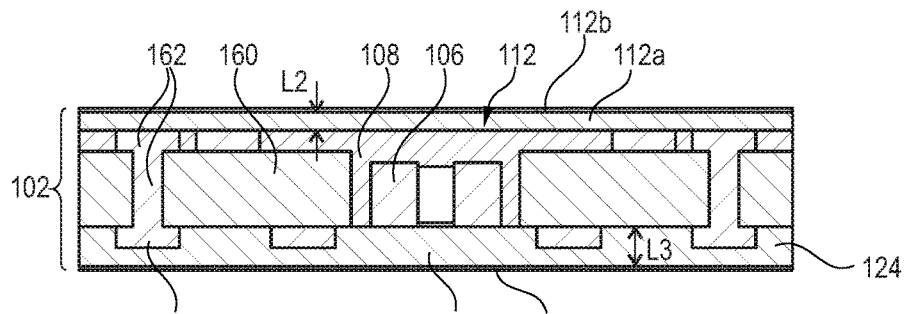
FIG. 13 illustrates a cross-sectional view of a structure obtained during carrying out a method of manufacturing a component carrier with an embedded component according to still another exemplary embodiment of the invention.

FIG. 13 illustrates a cross-sectional view of a structure obtained during carrying out a method of manufacturing a component carrier 100 with an embedded component 106 according to still another exemplary embodiment of the invention.

The structure shown in FIG. 13 differs from the structure shown in FIG. 4 in that an attached preform of the second electrically insulating layer structure 112 is embodied, according to FIG. 13, as a double layer comprising a dielectric layer 112a directly connected to the first electrically insulating layer structure 108 and a metallic layer 112b (such as a copper foil) forming part of an exterior main surface of the structure shown in FIG. 13. An attached preform of the third electrically insulating layer structure 124 is embodied, according to FIG. 13, as a double layer comprising a dielectric layer 124a directly connected to the core and a metallic layer 124b (such as a copper foil) forming part of an exterior main surface of the structure shown in FIG. 13. As second lamination material (i.e. a material forming the or forming the basis of the second electrically insulating layer structure 112) in the framework of a modified semi-additive process (mSAP) can be an insulating film (e.g., Ajinomoto Build-up film (ABF)®) with copper foil, or prepreg like material with copper foil, etc.

Before continuing the manufacturing process in a corresponding way as shown in FIG. 5 and FIG. 6, the metallic layers 112b, 124b may be removed from the structure shown in FIG. 13.

Figure 14:
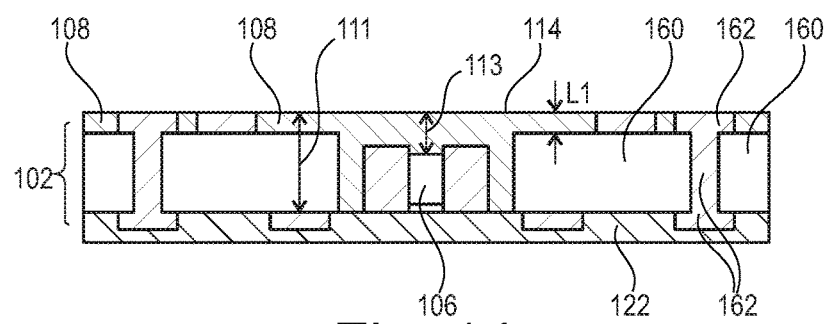
FIG. 14 illustrates a cross-sectional view of a structure obtained during carrying out a method of manufacturing a component carrier and illustrates roughness after the first lamination.

FIG. 14 illustrates a cross-sectional view of a structure obtained during carrying out a method of manufacturing a component carrier 100 and illustrates roughness after the first lamination.

What concerns the uneven thickness after first lamination, the range of dimple or projection may be for example between 50% and 20% of the total thickness. For example, in case of a core having a thickness of 200 µm, a dimple or projection can have a dimension of 100 µm plus approximately 40 µm. Reference numeral 111 denotes total thickness, whereas reference numeral 113 denotes dimple or projection extension.

Figure 15:
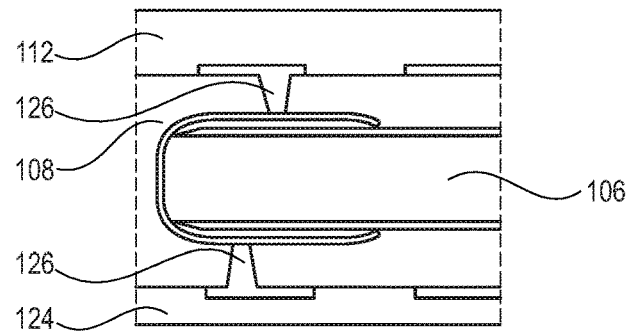
FIG. 15 and FIG. 16 illustrate images of cross-sections of component carriers manufactured according to exemplary embodiments of the invention.
Figure 16:
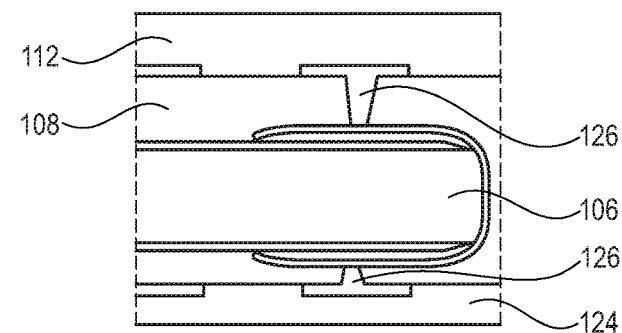

FIG. 15 and FIG. 16 each illustrates an image of a cross-section of a component carrier 100 with embedded component 106 manufactured according to exemplary embodiments of the invention. It can be taken from these experimental images that the first electrically insulating layer structure 108 and the second electrically insulating layer structure 112 are properly separated and distinguished.

In particular, exemplary embodiments of the invention relate to the following aspects:

Aspect 1. A component carrier (100), comprising: a base structure (102) comprising component carrier material and having a cavity (104); a component (106) embedded in the cavity (104); a first electrically insulating layer structure (108) connected to a front side of the base structure (102) and to the component (106) and at least partially filling a gap (110) between the component (106) and the base structure (102); a second electrically insulating layer structure (112) connected, in particular directly, to the first electrically insulating layer structure (108) at a connection surface (114) of the first electrically insulating layer structure (108), wherein the connection surface (114) opposes an opposing surface (116) of the second electrically insulating layer structure (112) facing away from the first electrically insulating layer structure (108).

Aspect 2. The component carrier (100) according to aspect 1, wherein the opposing surface (116) has a flatter surface profile than the connection surface (114).

Aspect 3. The component carrier (100) according to aspect 1 or 2, wherein the surface profile at the connection surface (114) has a maximum bottom-to-top distance (D) in a range between 0.5 µm and 30 µm.

Aspect 4. The component carrier (100) according to any one of aspects 1 to 3, wherein the connection surface (114) is non-planar and the opposing surface (116) is planar.

Aspect 5. The component carrier (100) according to any one of aspects 1 to 4, wherein a roughness of the connection surface (114) is in a range between 0.1 µm and 2 µm.

Aspect 6. The component carrier (100) according to any one of aspects 1 to 5, wherein a roughness of the opposing surface (116) is in a range between 0.3 µm and 1 µm.

Aspect 7. The component carrier (100) according to any one of aspects 1 to 6, wherein a maximum thickness (L1) of the first electrically insulating layer structure (108) on the base structure (102) is in a range between 20% and 80%, in particular is in a range between 55% and 65%, of an entire maximum thickness (L1+L2) of the first electrically insulating layer structure (108) plus the second electrically insulating layer structure (112) on the base structure (102).

Aspect 8. The component carrier (100) according to any one of aspects 1 to 7, wherein a maximum thickness (L2) of the second electrically insulating layer structure (112) on the base structure (102) is in a range between 20% and 80%, in particular in a range between 35% and 45%, of an entire maximum thickness (L1+L2) of the first electrically insulating layer structure (108) plus the second electrically insulating layer structure (112) on the base structure (102).

Aspect 9. The component carrier (100) according to any one of aspects 1 to 8, wherein the first electrically insulating layer structure (108) has a larger maximum thickness (L1) on the base structure (102) than a maximum thickness (L2) of the second electrically insulating layer structure (112) on the base structure (102).

Aspect 10. The component carrier (100) according to any one of aspects 1 to 9, wherein a material of the first electrically insulating layer structure (108) is the same as a material of the second electrically insulating layer structure (112).

Aspect 11. The component carrier (100) according to any one of aspects 1 to 9, wherein a material of the first electrically insulating layer structure (108) is different from a material of the second electrically insulating layer structure (112).

Aspect 12. The component carrier (100) according to any one of aspects 1 to 11, wherein the first electrically insulating layer structure (108) comprises a functionalized material, in particular at least one of the group consisting of a heat dissipation material, a stiffener material, and a coefficient of thermal expansion balancing material.

Aspect 13. The component carrier (100) according to any one of aspects 1 to 12, wherein at least one of the first electrically insulating layer structure (108) and the second electrically insulating layer structure (112) comprises resin, in particular epoxy resin, and optionally reinforcing particles, in particular at least one of glass fibers and glass spheres.

Aspect 14. The component carrier (100) according to any one of aspects 1 to 13, wherein the second electrically insulating layer structure (112) forms part of at least one of the group consisting of a polyethylene terephthalate film on an insulating film or Build-up Film, a copper foil on a pre-preg sheet, a copper foil on an insulating or Build-up Film, and Resin Coated Copper. An example Build-up Film is commercially available from Ajinomoto Co. Inc. of Tokyo, Japan. Ajinomoto refers to the product as Ajinomoto Build-up Film (ABF) or insulating film (ABF).

Aspect 15. The component carrier (100) according to any one of aspects 1 to 14, comprising a barrier layer (156), in particular capable of blocking migration of chlorine ions, between the first electrically insulating layer structure (108) and the second electrically insulating layer structure (112).

Aspect 16. The component carrier (100) according to any one of aspects 1 to 15, comprising at least one of the following features: wherein the first electrically insulating layer structure (108) is non-planar and/or the second electrically insulating layer structure (112) is planar; the component carrier (100) comprises at least one electrically conductive layer structure (120, 162), in particular comprising at least one of the group consisting of copper, aluminum, nickel, silver, gold, palladium, and tungsten, any of the mentioned materials being optionally coated with supra-conductive material such as graphene; the component carrier (100) comprises at least one electrically insulating layer structure (108, 112, 124, 128, 160), in particular comprising at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide; wherein the component (106) is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip; the component carrier (100) is shaped as a plate; the component carrier (100) is configured as a printed circuit board, or a substrate.

Aspect 17. A method of manufacturing a component carrier (100), wherein the method comprises: placing a component (106) in a cavity (104) of a base structure (102) comprising component carrier material; connecting a first electrically insulating layer structure (108) to a front side of the base structure (102) and the component (106) so that the connected first electrically insulating layer structure (108) fills at least partially a gap (110) between the component (106) and the base structure (102); connecting a second electrically insulating layer structure (112) to, in particular directly to, the first electrically insulating layer structure (108) at a connection surface (114) of the first electrically insulating layer structure (108), wherein the connection surface (114) opposes an opposing surface (116) of the second electrically insulating layer structure (112) facing away from the first electrically insulating layer structure (108).

Aspect 18. The method according to aspect 17, wherein the opposing surface (116) has a flatter surface profile than the connection surface (114)

Aspect 19. The method according to aspect 17 or 18, wherein at least part of at least one of the first electrically insulating layer structure (108) and the second electrically insulating layer structure (112) is in an at least partially uncured state before the respective connecting.

Aspect 20. The method according to any of aspects 17 to 19, wherein the method comprises attaching a temporary carrier (122) to a backside of the base structure (102) before placing the component (106) in the cavity (104) and on the temporary carrier (122).

Aspect 21. The method according to aspect 20, wherein the method comprises removing the temporary carrier (122) from the backside of the base structure (102) after, in particular directly after, the connecting of the first electrically insulating layer structure (108), in particular before, more particularly directly before, the connecting of the second electrically insulating layer structure (112).

Aspect 22. The method according to any one of aspects 17 to 21, wherein the method comprises simultaneously connecting the second electrically insulating layer structure (112) to the first electrically insulating layer structure (108) and connecting a third electrically insulating layer structure (124) to a backside of the base structure (102) and to the component (106), and optionally to the first electrically insulating layer structure (108).

Aspect 23. The method according to aspect 22, wherein a maximum thickness (L3) of the connected third electrically insulating layer structure (124) is larger than a maximum thickness (L2) of the connected second electrically insulating layer structure (112).

Aspect 24. The method according to any one of aspects 17 to 23, wherein the method comprises forming at least one electrically conductive vertical through connection (126)

through both the first electrically insulating layer structure (108) and the second electrically insulating layer structure (112) for electrically contacting the component (106) after connecting the second electrically insulating layer structure (112) to the first electrically insulating layer structure (108).

Aspect 25. The method according to any one of aspects 17 to 24, wherein the method comprises connecting at least one further electrically insulating layer structure (128) and/or at least one electrically conductive layer structure (120) onto a respective exterior one of the electrically insulating layer structures (112, 124).

It should be noted that the term "comprising" does not exclude other elements or steps and the article "a" or "an" does not exclude a plurality. Also, elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a base structure comprising component carrier material and having a cavity;
   a component embedded in the cavity;
   a first electrically insulating layer structure connected to a front side of the base structure and to the component and at least partially filling a gap between the component and the base structure;
   a second electrically insulating layer structure connected directly to the first electrically insulating layer structure at a connection surface of the first electrically insulating layer structure, wherein the connection surface opposes an opposing surface of the second electrically insulating layer structure facing away from the first electrically insulating layer structure,
   wherein the opposing surface has a flatter surface profile than a respective surface profile of the connection surface,
   wherein the surface profile at the connection surface has a maximum bottom-to-top distance in a range between 0.5 μm and 30 μm.

2. The component carrier according to claim 1, wherein the connection surface is non-planar and the opposing surface is planar.

3. The component carrier according to claim 1, wherein a roughness of the connection surface is in a range between 0.1 μm and 2 μm.

4. The component carrier according to claim 1, wherein a roughness of the opposing surface is in a range between 0.3 μm and 1 μm.

5. The component carrier according to claim 1, wherein a maximum thickness (L1) of the first electrically insulating layer structure on the base structure is in a range between 20% and 80% of an entire maximum thickness (L1+L2) of the first electrically insulating layer structure plus the second electrically insulating layer structure on the base structure.

6. The component carrier according to claim 1, wherein a maximum thickness (L2) of the second electrically insulating layer structure on the base structure is in a range between 20% and 80% of an entire maximum thickness (L1+L2) of the first electrically insulating layer structure plus the second electrically insulating layer structure on the base structure.

7. The component carrier according to claim 1, wherein the first electrically insulating layer structure has a larger maximum thickness (L1) on the base structure than a maximum thickness (L2) of the second electrically insulating layer structure on the base structure.

8. The component carrier according to claim 1, wherein a material of the first electrically insulating layer structure is the same as a material of the second electrically insulating layer structure.

9. The component carrier according to claim 1, wherein a material of the first electrically insulating layer structure is different from a material of the second electrically insulating layer structure.

10. The component carrier according to claim 1, wherein the first electrically insulating layer structure comprises a functionalized material including at least one of the group consisting of a heat dissipation material, a stiffener material, and a coefficient of thermal expansion balancing material.

11. The component carrier according to claim 1, wherein at least one of the first electrically insulating layer structure and the second electrically insulating layer structure comprises resin and optionally reinforcing particles, wherein when reinforcing particles are present the reinforcing particles include at least one of glass fibers and glass spheres.

12. The component carrier according to claim 1, wherein the second electrically insulating layer structure forms part of at least one of the group consisting of a polyethylene terephthalate film on a Build-up Film, a copper foil on a prepreg sheet, a copper foil on a Build-up Film, and Resin Coated Copper.

13. A component carrier, comprising:
   a base structure comprising component carrier material and having a cavity;
   a component embedded in the cavity;
   a first electrically insulating layer structure connected to a front side of the base structure and to the component and at least partially filling a gap between the component and the base structure;
   a second electrically insulating layer structure connected directly to the first electrically insulating layer structure at a connection surface of the first electrically insulating layer structure, wherein the connection surface opposes an opposing surface of the second electrically insulating layer structure facing away from the first electrically insulating layer structure, and
   a barrier layer capable of blocking migration of chlorine ions between the first electrically insulating layer structure and the second electrically insulating layer structure.

14. The component carrier according to claim 1, comprising at least one of the following features:
   wherein the first electrically insulating layer structure is non-planar and/or the second electrically insulating layer structure is planar;
   the component carrier comprises at least one electrically conductive layer structure comprising at least one of the group consisting of copper, aluminum, nickel, silver, gold, palladium, and tungsten, any of the mentioned materials being optionally coated with graphene;
   the component carrier comprises at least one electrically insulating layer structure comprising at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

wherein the component is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip;

the component carrier is shaped as a plate;

the component carrier is configured as a printed circuit board, or a substrate.

15. A method of manufacturing a component carrier, wherein the method comprises:

placing a component in a cavity of a base structure comprising component carrier material;

connecting a first electrically insulating layer structure to a front side of the base structure and the component so that the connected first electrically insulating layer structure fills at least partially a gap between the component and the base structure;

connecting a second electrically insulating layer structure to the first electrically insulating layer structure at a connection surface of the first electrically insulating layer structure, wherein the connection surface has a maximum bottom-to-top distance in a range between 0.5 µm and 30 µm and opposes an opposing surface of the second electrically insulating layer structure facing away from the first electrically insulating layer structure, wherein the opposing surface has a flatter surface profile than the connection surface.

16. The method according to claim 15, wherein at least part of at least one of the first electrically insulating layer structure and the second electrically insulating layer structure is in an at least partially uncured state before the respective connecting.

17. The method according to claim 15, comprising at least one of the following features:

wherein the method comprises attaching a temporary carrier to a backside of the base structure before placing the component in the cavity and on the temporary carrier;

wherein the method comprises removing the temporary carrier from the backside of the base structure after the connecting of the first electrically insulating layer structure, in particular before, more particularly directly before, the connecting of the second electrically insulating layer structure;

wherein the method comprises simultaneously connecting the second electrically insulating layer structure to the first electrically insulating layer structure and connecting a third electrically insulating layer structure to a backside of the base structure and to the component, and optionally to the first electrically insulating layer structure, wherein a maximum thickness (L3) of the connected third electrically insulating layer structure is larger than a maximum thickness (L2) of the connected second electrically insulating layer structure;

wherein the method comprises forming at least one electrically conductive vertical through connection through both the first electrically insulating layer structure and the second electrically insulating layer structure for electrically contacting the component after connecting the second electrically insulating layer structure to the first electrically insulating layer structure;

wherein the method comprises connecting at least one further electrically insulating layer structure and/or at least one electrically conductive layer structure onto a respective exterior one of the electrically insulating layer structures.

* * * * *